United States Patent [19]

Schuerwegen et al.

[11] Patent Number: 5,397,677
[45] Date of Patent: Mar. 14, 1995

[54] TRANS-LAMINATING PROCESS

[75] Inventors: Ronald Schuerwegen, Schelle; Eddie Daems; Luc Leenders, both of Herentals, all of Belgium

[73] Assignee: AGFA-Gevaert, N.V., Mortsel, Belgium

[21] Appl. No.: 104,658

[22] Filed: Aug. 11, 1993

[30] Foreign Application Priority Data

Aug. 25, 1992 [EP] European Pat. Off. ............ 92202588

[51] Int. Cl.⁶ ..................... G03C 11/12; B44C 1/165
[52] U.S. Cl. .................................. 430/256; 430/257; 156/230; 156/239; 156/240; 156/241
[58] Field of Search ................ 430/256, 257; 156/230, 156/239, 240, 241

[56] References Cited

U.S. PATENT DOCUMENTS 4,766,053  8/1988  Shinozaki et al. ................ 430/256
5,043,247  8/1991  Daems et al. ..................... 430/256

Primary Examiner—Richard L. Schilling
Attorney, Agent, or Firm—Breiner & Breiner

[57] ABSTRACT

A process is described for trans-laminating an image-carrying sheet from a first laminated product, comprising the image-carrying sheet, an adhesive layer and a release sheet, to a second laminated product, comprising the image-carrying sheet, the adhesive layer and an ultimate support sheet. The process comprises the steps of:

(i) temporarily adhering at least a leading edge portion of the image carrying sheet (12) of the first laminated product (10) to a surface (20) of a support member (22);

(ii) temporarily adhering a leading edge portion of the ultimate support sheet (34) to the surface (20) of the support member (22) at a location adjacent the image-carrying sheet (12);

(iii) separating the release sheet (14) from the image-carrying sheet (12) while the image-carrying sheet (12) remains adhered to the surface (20) of the support member (22), with the adhesive layer (16) facing upwardly;

(iv) simultaneously or subsequently moving the support member (22), with the image-carrying sheet (12) adhered thereto, together with the ultimate support sheet (34), between a pair of rollers (28, 30) thereby to press the ultimate support sheet (34) downwardly against the image carrying sheet (12) to form the second laminated product (38), the leading edges of the image carrying sheet (12) and the ultimate support sheet (34) being substantially parallel to the axes of rotation of said rollers (28,30); and (v) thereafter releasing the second laminated product (38) from the surface of the support member (22).

The process achieves the translamination without causing folds or stretches to occur in the product.

7 Claims, 1 Drawing Sheet

TRANS-LAMINATING PROCESS

DESCRIPTION

The present invention relates to a trans-laminating process, in particular to a process for trans-laminating an image-carrying sheet from a first laminated product to a second laminated product.

In the field of pre-press graphic arts, there has been a long felt need for a simple and fast technique offering "colour proofs" of high quality and reproducibility.

Photographically produced colour proofs are a simulation for multicolour halftone reproductions as will be produced by successive printing in register with the separate standard inks: magenta, yellow, cyan and black on a conventional printing press.

Press proofing for the production of colour proofs by preparing a printing plate on the press to produce only a few copies as proof of quality of the halftone separation transparencies used in the plate production is a very cumbersome and expensive procedure and therefore photographic processes have been developed to obtain a similar result by means of which the appearance of a print starting from particular colour separation negatives or positives can be judged by the printer or client. In a system such as the AGFAPROOF system, as described in European Patent Specification EP 0 185 410 (Agfa-Gevaert), a multi-colour relief image on a permanent support is produced photographically. In U.S. Pat. No. 4,766,053 (Shinozaki et al.), a method is proposed wherein an image layer formed on a light-sensitive material is peeled apart from an image receiving sheet and transferred to a permanent support, such as paper, a metallic plate, plastic film or cloth. To produce a proof, the peel-off backing is removed and the image carrying sheet is transferred to an ultimate substrate. However, it is found that the nature of the ultimate substrate has some effect upon the perception of the image, for example by subtle changes in perceived colour balance and/or image density.

If one attempts to trans-laminate the image carrying sheet to some materials, such as newsprint stock, which will form the substrate of the ultimate print run, and therefore should provide the most accurate proof, it has been found difficult to obtain accurate lamination with the result that folds and/or stretches occur in the product resulting in distorted images.

SUMMARY OF THE INVENTION

We have now discovered a simple process whereby accurate trans-lamination can be achieved in a reliable manner.

Thus, according to the invention, there is provided a process for trans-laminating an image-carrying sheet from a first laminated product, comprising the image-carrying sheet, an adhesive layer and a release sheet, to a second laminated product, comprising the image-carrying sheet, the adhesive layer and an ultimate support sheet, the process comprising the steps of:

(i) temporarily adhering at least a leading edge portion of the image carrying sheet of the first laminated product to a surface of a support member;

(ii) temporarily adhering a leading edge portion of the ultimate support sheet to the surface of the support member at a location adjacent the image-carrying sheet;

(iii) separating the release sheet from the image-carrying sheet while the image-carrying sheet remains adhered to the surface of the support member, with the adhesive layer facing upwardly;

(iv) simultaneously or subsequently moving the support member, with the image-carrying sheet adhered thereto, together with the ultimate support sheet, between a pair of rollers thereby to press the ultimate support sheet downwardly against the image carrying sheet to form the second laminated product, the leading edges of the image carrying sheet and the ultimate support sheet being substantially parallel to the axes of rotation of said rollers; and (v) thereafter releasing the second laminated product from the surface of the support member.

DETAILED DESCRIPTION

The image-carrying sheet is usually formed of flexible material, such as polyethylene teraphthalate film, having an adhesive layer on the opposite face to the image and a subbing layer on the image side.

The image is produced photographically, by means well known in the art, such as described in EP 0 185 410, referred to above. The method described in EP 0 185 410 comprises the following steps:

1) the scanningwise exposure of a multicolour original attached to a rotating scanner drum in order to obtain separate red light, green light and blue light output signals received by photon detector to produce corresponding electrical signals, which are fed into a computer, 2) the computer controlled exposure, of differently coloured hardening developable photographic materials each comprising on a temporary support one or more hardenable hydrophilic colloid layers at least one of which contains dispersed photosensitive silver halide, either 3) transferring integrally said hydrophilic colloid layer(s) of a first of said exposed photographic onto a permanent support, which at its surface is less hydrophobic than the temporary support, by pressing the permanent support in the presence of an aqueous liquid against the hydrophobic colloid layer side of said photographic material and removing the temporary support, thus leaving said hydrophilic colloid layer(s) on said permanent support, and 4) developing the transferred exposed photosensitive silver halide with a hardening developing agent to form imagewise hardened coloured hydrophilic coloured portions to leave a coloured relief image on the permanent support, and 5) producing a multi colour pattern on said permanent support by repeating steps 3) and 4) with one or more other Scanning-wise exposed differently coloured photographic materials, the transfer procedure of step 3) being effected in image register.

However the direct exposure by the scanner output laser of the different coloured materials requires the presence of special silver halide emulsions spectrally sensitized to the emission wavelength of the laser of the scanner used. A more traditional procedure consists in generating by a scanner colour separation negatives or positives on a scan film and exposing the described coloured colloid materials through these separation negatives and positives in a conventional contact-apparatus provided with an ultraviolet rich radiation source. In this way rather insensitive nonspectrally sensitized emulsions rich in chloride can be used. In any case, the process by which the multicolour image is formed is not critical to the present invention.

The permanent support mentioned in EP 0 185 410 can be an organic polymeric resin support, e.g. a polyethylene terephthalate support, or it can be a paper base, e.g. a polyolefin covered paper base.

The release sheet may be formed of double sided polyethylene coated paper, having one glossy side and one matt side. The coating may be pigmented. The release side of the release sheet is preferably coated with a release material such as a silicone.

The image-carrying sheet is laminated to the release sheet by an adhesive which is retained on the image-carrying sheet when the release sheet is separated. This requires a relationship between the surface characteristics of the image carrying sheet and those of the release sheet as described in more detail in U.S. Pat. No. 4,766,053, referred to above.

The ultimate support sheet is usually formed of material, such as paper, aluminium plate, cardboard and plastic. In a preferred embodiment, the ultimate support sheet is paper, most preferably newsprint paper stock.

The support member is preferably formed of rigid material selected from metal and plastics materials such as PVC, polystyrene or polymethylmethacrylate. The surface of the support member to which the image carrying sheet and the ultimate support sheet are adhered, is preferably flat. This surface may be planar as is the case when the support member is a flat rigid plate, or it may be curved as is the case when the support member is cylindrical, for instance by being constituted by one of the pair of rollers. The dimensions of the surface of the support member are preferably greater than those of the laminated products.

The means whereby the image carrying sheet is adhered to the support member may be selected from mechanical, adhesive, electrostatic, and pneumatic means. For simplicity, we prefer adhesive means by the provision of a region on the support member carrying an adhesive which adheres to the image carrying sheet more strongly than does the release sheet, so that the release sheet may be peeled from the image carrying sheet without removing the image carrying sheet from the support member. Where means are provided to adhere the ultimate support sheet to the support member, this again may be selected from mechanical, adhesive, electrostatic, and pneumatic means. For simplicity, we again prefer adhesive means, especially a release adhesive which enables the second laminated product to be easily removed from the support member at the end of the process, without damage to the product. The support member may then be re-used.

Whatever means are used to adhere the image carrying sheet to the support member, it is essential that the force of adhesion between the image carrying sheet and the support member is greater than that between the release sheet and the image carrying sheet so that the release sheet can be peeled away to leave the image carrying sheet adhered to the support member.

The pair of rollers are preferably a pair of driven co-operating rollers having a resilient surface, for example, of rubber or resilient plastic material. They should be so spaced as to apply sufficient pressure to the support member as it passes there-between, so as to laminate the ultimate support sheet to the image carrying sheet. In one embodiment of the invention, the rollers are heated.

The invention will now be described in more detail, with reference to the accompanying drawings, in which:

BRIEF DESCRIPTION OF THE DRAWINGS

In FIG. 1 of the drawings, there is shown a first laminated product 10 which consists of an image carrying sheet 12 formed of flexible polyethylene film, having a thickness of 23 μm, which is laminated to a release sheet 14 having a weight of 152 g/m². The product has the dimensions of 720 mm by 1200 mm. The image carrying sheet 12 is secured to the release sheet 14 by means of a layer 16 of adhesive carried on the back face of the image carrying sheet 12. The outer surface of the image carrying sheet 12 carries a photographically produced image 18.

Figure 1:
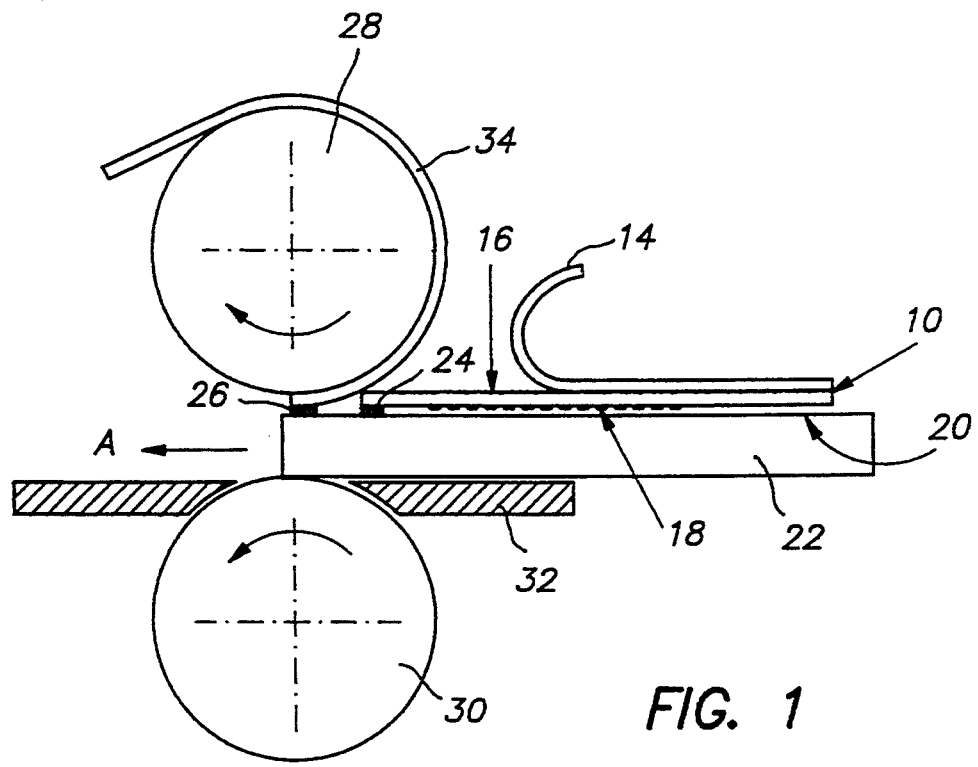
FIG. 1 shows in diagrammatic cross section a device being used in a process according to the invention.

The first laminated product 10 is laid on the flat upper surface 20 of a rigid support plate 22 having dimensions of 800 mm by 1500 mm by 8 mm thickness. The surface 20 carries, towards one end thereof, two strips 24, 26 of adhesive tape, positioned with an exposed adhesive surface. The first strip 24 is formed of "Tesafix 4961" double sided tape (ex BDF). The leading edge of the image carrying sheet 12 is secured to the first strip of adhesive tape 24, which is nearest thereto. The image carrying sheet adheres to the adhesive tape 24 and the adhesive tape adheres to the support plate 22 with a force which is greater than that required to peel the release sheet 14 away from the image carrying sheet 12. The second strip 26 is formed of "Scotch No 558—Post-it" tape (ex 3M) which is a frisket adhesive carried on a paper backing, and this in turn is secured to the support plate by double sided tape.

A pair of co-operating resilient rollers 28, 30 are positioned to allow the support plate 22 to pass between them, in the direction of the arrow A, the spacing between the rollers being such as to apply sufficient pressure to the support plate 22 as it passes there-between. The rollers are formed of NBR natural rubber and each have a diameter of 60 mm. The rollers are arranged to be driven in the direction of the curved arrows, and optionally in the reverse direction, by drive means not shown.

A fixed table 32, extending across the width of the rollers, ensures that the support plate remains in a horizontal position as it passes between the rollers 28, 30.

A sheet of newsprint paper stock 34, which is marginally larger than the image carrying sheet 12, is supplied from a source not shown, such as a sheet feeder. The sheet 34 is laid over the first laminated product 10 and has its leading edge secured to the second strip of adhesive tape 26 on the flat surface 20 of the support plate 22. The leading edges of the image carrying sheet 12 and the newsprint paper stock sheet 34 are substantially parallel to each other and to the axes of rotation of the rollers 28 and 30.

The arrangement shown is operated substantially as follows. The support plate 22 is positioned on the fixed table 32 and the rollers are driven in the direction of the curved arrows, to reach the position shown in FIG. 1, with one end of the support plate 22 being located between the pressure rollers 28, 30. The paper sheet is laid over the upper roller 28, enabling the release sheet 14 to be peeled off completely. At this moment the adhesive layer on the back of the image carrying sheet 12 is facing upwardly and the rollers are driven further in the direction of the curved arrows. This causes the support plate 22 to be fed in the direction of the arrow A. As the support plate 22 passes between the rollers, the adhering surface of the image carrying sheet 12 is pressed against the surface of the paper sheet 34, thereby laminating the image carrying sheet thereto. During this process, the paper sheet 34 is held against the upper roller 28 by hand, or by mechanical means not shown, to prevent it from falling in an uncontrolled manner on to the adhesive layer on the back of the image carrying sheet.

In an alternative embodiment of the process, as the support plate is fed between the rollers 28, 30, the operator continues to hold the free end of the release sheet 14, to progressively delaminate this sheet from the image carrying sheet 12, leaving the release adhesive 16 exposed on the image carrying sheet.

Figure 2:
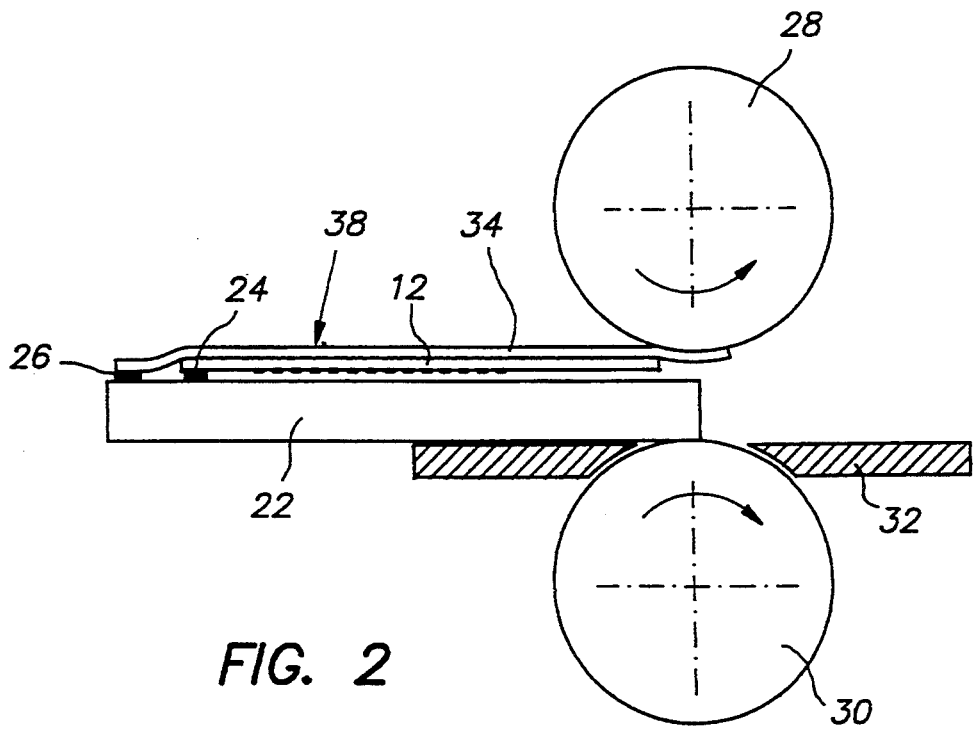
FIG. 2 is the same view as FIG. 1, at a later stage in the process.

The position shown in FIG. 2 is then reached, where the support plate 22 has passed almost completely through the rollers 28, 30. A second laminated product 38 has now been formed, comprising the image carrying sheet 12 laminated to the newsprint sheet 34. The second laminated product 38 can then be removed from the support plate 22 by lifting the product away from the adhesive strips 24, 26. If it is arranged that the force of adhesion between the adhesive strips 24, 26 and the support plate 22 are greater than the adhesion between these adhesive strips and the second laminated product, the latter can be removed leaving the adhesive strips 24, 26 in place enabling the support plate 22 to be reused. To help achieve this relationship, the support plate is preferably formed of a rigid plastics material such as PVC. Metal plates, such as those formed of aluminium or steel are less suitable.

I claim:

1. A process for trans-laminating an image-carrying sheet from a first laminated product, comprising the image-carrying sheet, an adhesive layer and a release sheet, to a second laminated product, comprising the image-carrying sheet, the adhesive layer and an ultimate support sheet, the process comprising the steps of:
   (i) temporarily adhering at least a leading edge portion of the image carrying sheet of the first laminated product to a surface of a support member;
   (ii) temporarily adhering a leading edge portion of the ultimate support sheet to the surface of the support member at a location adjacent the image-carrying sheet;
   (iii) separating the release sheet from the image-carrying sheet while the image-carrying sheet remains adhered to the surface of the support member, with the adhesive layer facing upwardly;
   (iv) simultaneously or subsequently moving the support member, with the image-carrying sheet adhered thereto, together with the ultimate support sheet, between a pair of rollers thereby to press the ultimate support sheet downwardly against the image-carrying sheet to form the second laminated product, the leading edges of the image-carrying sheet and the ultimate support sheet being substantially parallel to the axes of rotation of said rollers; and
   (v) thereafter releasing the second laminated product from the surface of the support member wherein the image-carrying sheet is laminated to the release sheet by an adhesive layer which is retained on the image-carrying sheet when the release sheet is separated.

2. A process according to claim 1, wherein the ultimate sheet comprises paper.

3. A process according to claim 2, wherein the ultimate support sheet comprises news print paper stock.

4. A process according to claim 1, wherein the support member is formed of rigid material.

5. A process according to claim 4, wherein the surface of the support member is a flat surface.

6. A process according to claim 1, wherein the support member is in the form of a rigid plate having a flat surface, a region of said surface carrying an adhesive to temporarily adhere the image-carrying sheet thereto.

7. A process according to claim 6, wherein the adhesive region is constituted by a strip of double-sided tape.

* * * * *